United States Patent [19]

Ozawa

[11] Patent Number: 5,271,089
[45] Date of Patent: Dec. 14, 1993

[54] SPEECH PARAMETER ENCODING METHOD CAPABLE OF TRANSMITTING A SPECTRUM PARAMETER AT A REDUCED NUMBER OF BITS

[75] Inventor: Kazunori Ozawa, Tokyo, Japan

[73] Assignee: NEC Corporation, Tokyo, Japan

[21] Appl. No.: 787,596

[22] Filed: Nov. 4, 1991

[30] Foreign Application Priority Data

Nov. 2, 1990 [JP] Japan .................................. 2-297600
Feb. 26, 1991 [JP] Japan .................................. 3-103267

[51] Int. Cl.$^5$ .............................................. G01L 5/00
[52] U.S. Cl. .................................... 395/2.31; 395/2.2; 395/2.39; 381/30; 381/36; 381/43
[58] Field of Search ............................. 381/30, 36, 43; 395/2.2, 2.31, 2.39

[56] References Cited

U.S. PATENT DOCUMENTS

| | | | |
|---|---|---|---|
| 4,868,867 | 9/1989 | Davidson et al. | 381/36 |
| 4,878,230 | 10/1989 | Murakami et al. | 375/27 |
| 4,905,288 | 2/1990 | Gerson et al. | 381/30 |
| 4,944,012 | 7/1990 | Morio et al. | 381/30 |
| 4,975,957 | 12/1990 | Ichikawa et al. | 381/36 |
| 5,012,517 | 4/1991 | Wilson et al. | 381/36 |
| 5,056,150 | 10/1991 | Yu et al. | 381/43 |
| 5,077,798 | 12/1991 | Ichikawa et al. | 381/36 |
| 5,115,469 | 5/1992 | Taniguchi et al. | 381/36 |

FOREIGN PATENT DOCUMENTS

0411655 2/1991 European Pat. Off. .

OTHER PUBLICATIONS

M. Schroeder et al., "Code–Excited Linear Prediction (CELP): High-Quality . . . Very Low Bit Rates", Proceedings of ICASSP (1985), pp. 937–940.
W. Kleijn et al., "Improved Speech Quality and Efficient Vector Quantization in SELP", Proceedings of ICASSP (1988), pp. 155–158.
T. Moriya et al., "Transform Coding of Speech Using a Weighted Vector Quantizer", IEEE Journal on Selected Areas in Communications, vol. 6, No. 2, Feb. 1988, pp. 425–431.
N. Sugamura et al., "Quantizer Design in LSP Speech Analysis–Synthesis", IEEE Journal on Selected Areas in Communications, vol. 6, No. 2, Feb. 1988, pp. 432–440.
Y. Linde et al., "An Algorithm for Vector Quantizer Design", IEEE Transactions on Communications, vol. COM-28, No. 1, Jan. 1980, pp. 84–95.
M. Honda, "Vector Quantization of LPC Parameters Using Weighted Spectral Distortion Measure", Acoustical Society of Japan (1989), pp. 195–196.
C. Tsao et al., "Matrix Quantizer Design for LPC Speech Using the Generalized Lloyd Algorithm", IEEE Trans. on Acoustics, Speech, and Signal Processing, vol. ASSP-33, No. 3, Jun. 1985, pp. 537–545.
Speech Processing 1—Proceedings of the International Conference on Acoustics, Speech, and Signal Processing (ICASSP 89, Glasgow) vol. 1, 1989, pp. 160–163, New York, U.S., Y. Shoham: "Cascaded Likelihood Vector Coding of the LPC Information".

*Primary Examiner*—Michael R. Fleming
*Assistant Examiner*—Tariq R. Hafiz
*Attorney, Agent, or Firm*—Sughrue, Mion, Zinn, Macpeak & Seas

[57] ABSTRACT

In a speech parameter encoding method of encoding an input speech signal into a sequence of encoded signals, vector quantization is carried out through a plurality of vector quantizers which are connected in cascade to one another through subtractors and which cooperate with code books, respectively. Such a cascade connection of the vector quantizers may be supplied with the input speech signal either at every frame or at every subframe shorter than the frame to produce a set of code vector candidates from each of the vector quantizers. Each set of the code vector candidates is sent to a cumulative distortion calculator to select an optimum combination of the code vector candidates and to produce, as the encoded signals, an index representative of the optimum combination. Alternatively, a sequence of coefficients which represent a spectrum parameter is calculated at every frame and is divided into a plurality of coefficient groups each of which is subjected to vector quantization to produce a plurality of code vector candidates for each coefficient group. Cumulative distortions are calculated for combinations of the code vector candidates to select an optimum combination.

25 Claims, 8 Drawing Sheets

SPEECH PARAMETER ENCODING METHOD CAPABLE OF TRANSMITTING A SPECTRUM PARAMETER AT A REDUCED NUMBER OF BITS

BACKGROUND OF THE INVENTION

This invention relates to an encoding method and an encoding system for use in effectively encoding a speech signal at a low bit rate which is not higher than eight kilobits/s.

A conventional encoding method of the type described is known as a Code Excited LPC Coding (CELP) method which is disclosed, for example, in a paper which is mentioned by M. Schroeder and B. Atal in Proceedings of ICASSP (1985) (pages 937-940) and which is entitled "Code-Excited Linear Prediction" (will be called Reference 1). Such a method is also disclosed in a paper which is mentioned by Klenijn in Proceedings of ICASSP (1988) (pages 155-158) and which is entitled "Improved Speech Quality and Efficient Vector Quantization in SELP" (will be called Reference 2).

At any rate, each of the conventional methods at first extracts, at a transmitting end, spectrum parameters from a speech signal divided into a plurality of frames each of which has a frame period of, for example, 20 milliseconds. Each of the spectrum parameters specifies a spectrum characteristic of the speech signal. Thereafter, each of the frames is subdivided into a plurality of subframes each of which is shorter than the frame and which is equal, for example, to 5 milliseconds. At every one of the subframes, pitch parameters are extracted to represent a long-term correlation (pitch correlation) on the basis of excitation signal which is calculated in the past. A long-term prediction of the speech signal in each subframe is carried out by the use of the pitch parameters to calculate a residue signal from the long-term prediction. Synthesized signals are produced by the use of random signals, namely, waveform patterns selected from a predetermined species of random signals stored in a code book. Subsequently, a single species of the random signals is selected such that error power becomes minimum between the speech signal and the synthesized signals. In addition, an optimum gain of the single species of the random signals is calculated in relation to the residue signal.

Thereafter, indices which are indicative of both the single species of the random signals and the gain are transmitted together with the spectrum parameters and the pitch parameters.

Herein, effective quantization of the spectrum parameters should be considered in addition to quantization of the excitation signal so as to reduce the bit rate in the CELP method.

In the above-mentioned CELP method, LPC parameters which are calculated by an LPC analysis are quantized as the spectrum parameters by the use of scalar quantization and are specified by LPC coefficients having an order. In this event, such scalar quantization requires thirty-four bits at every frame, namely, 1.7 kb/s as a bit number so as to quantize the tenth order of the LPC coefficients. A further reduction of the above-mentioned bit number results in a deterioration of a speech quality.

In order to more effectively quantize the LPC parameters, a vector-scalar quantization method is proposed by Moriya et al in a paper which is entitled "Transform Coding of Speech Using a Weighted Vector Quantizer" (IEEE J. Sel. Areas, Commun., pages 425-431, 1988) and which will be referred to as Reference 3. However, a bit number from twenty-seven bits to thirty bits is necessary even in the proposed method.

It is possible to decrease the bit number by lengthening each frame length. However, it is difficult to precisely represent a temporal variation of a spectrum as each frame length becomes long, which results in a deterioration of a speech quality.

SUMMARY OF THE INVENTION

It is an object of this invention to provide an encoding method which is capable of quantizing each speech parameter by the use of a small number of bits.

It is another object of this invention to provide an encoding method of the type described, which can avoid a reduction of a speech quality even when each speech parameter is quantized by the use of a small number of bits.

It is still another object of this invention to provide an encoding device which is capable of effectively encoding speech parameters.

A speech parameter encoding method to which this invention is applicable is for use in encoding a speech signal into a sequence of output encoded signals. According to an aspect of this invention, the method comprises the steps of dividing the speech signal into a sequence of partial speech signals each of which has a predetermined period, successively calculating a spectrum parameter at every one of the partial speech signals, and successively giving the spectrum parameter at a predetermined one of the partial speech signals to a first stage of vector quantization units which are connected in cascade to the following stages of the vector quantization units. Each of said vector quantization units carries out vector quantization by the use of a code book which stores a plurality of code vectors. The method further comprises the steps of calculating a first set of code vector candidates in the first stage by the use of the code book of the first stage in consideration of quantization distortions between the spectrum parameter and each of the code vectors stored in the code book of the first stage, calculating error signals between the first set of the code vector candidates and the spectrum parameter, consecutively calculating other code vector candidates from a next following one of the stages to a last one of the stages to produce the other code vector candidates as second through last sets of the code vector candidates in connection with the error signals calculated by a preceding one of the stages, selecting a specific one of combinations of the first through last sets of the code vector candidates that is concerned with the quantization distortions calculated in each of the first through last stages, and producing said specific one of the combinations as the output encoded signals.

A speech parameter encoding method according to another aspect of this invention comprises the steps of dividing the speech signal into a sequence of frame speech signals each of which lasts for a frame period, calculating the spectrum parameter to a predetermined order for each of the frame speech signals to produce a restricted spectrum parameter of the predetermined order represented by the coefficients having a dimension number which is equal to the predetermined order, carrying out vector quantization for the restricted spectrum parameter through a plurality of vector quantizer stages to produce a set of code vector candidates from at least one of the vector quantizer stages and to produce the other sets of code vector candidates from the other code vector quantizer stage by dividing the coefficients of said restricted spectrum parameter into a plurality of partial coefficients each of which has a partial dimension smaller than the dimension number of the restricted spectrum parameter, by preparing a plurality of code books for the partial coefficients, and by searching the code books for the respective partial coefficients, calculating cumulative distortions for combinations of the set and the other sets of the code vector candidates, selecting a specific one of the combinations that minimizes the cumulative distortions, and producing the specific one of the combinations as the output encoded signals.

DESCRIPTION OF THE PREFERRED EMBODIMENTS

Figure 1:
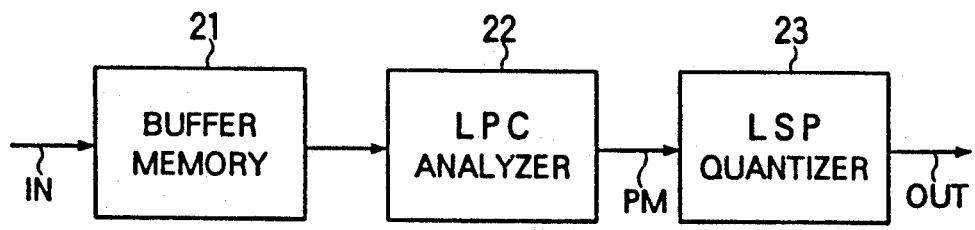
FIG. 1 is a block diagram of a speech parameter encoding device according to a first embodiment of this invention.

Referring to FIG. 1, a speech parameter encoding device according to a first embodiment of this invention is operable in accordance with an encoding method based on a principle of this invention, as will become clear. The illustrated speech parameter encoding device (abbreviated to an encoding device hereinafter) is supplied with an input speech signal IN to produce a sequence of output signals, namely, encoded speech signals OUT. As illustrated in FIG. 1, the encoding device comprises a buffer memory 21, a linear prediction coding (LPC) analyzer 22, and a line spectrum pair (LSP) quantizer 23. Specifically, the input speech signal IN is stored in the buffer memory 21 at every frame having a frame period of, for example, 20 milliseconds. In other words, the input speech signal IN within each frame is successively stored as a stored speech signal in the buffer memory 21 and may be called a frame speech signal which lasts for each frame period. Thus, the input speech signal IN is given to the buffer memory 21 after the input speech signal IN is divided into a plurality of frames. The stored speech signal is read out of the buffer memory 21 at every frame and supplied to the LPC analyzer 22 as a readout speech signal. The LPC analyzer 22 carries out a spectrum analysis of the readout speech signal on the basis of a known LPC analysis to calculate a spectrum parameter representative of a spectrum characteristic of the stored partial signal. The spectrum parameter may be composed of linear prediction coding (LPC) coefficients, such as line spectrum pair (LSP) coefficients PM which have a dimension specified by a dimension number. Such calculation of line spectrum pair (LSP) coefficients PM can be carried out by the use of a calculation method which is disclosed by Sugamura et al in a paper entitled, "Quantizer Design in LSP Speech Analysis-Synthesis," (will be called Reference 4) (IEEE J. Sel. Areas Commun., pages 425–431, 1988). Thus, the line spectrum pair (LSP) coefficients PM are calculated as the spectrum parameter to a predetermined order L by the LPC analyzer 22 to be sent to the LSP quantizer 23.

Supplied with the LSP coefficients PM calculated for each frame, the LSP quantizer 23 quantizes the LSP coefficients into quantized coefficients each of which has a preselected quantization bit number. Thereafter, the LSP quantizer 23 produces, as the output signals OUT, a code LK corresponding to the quantized coefficients in a manner to be described later in detail. Herein, it is assumed that the LSP quantizer 23 is formed by a vector quantizer.

Figure 2:
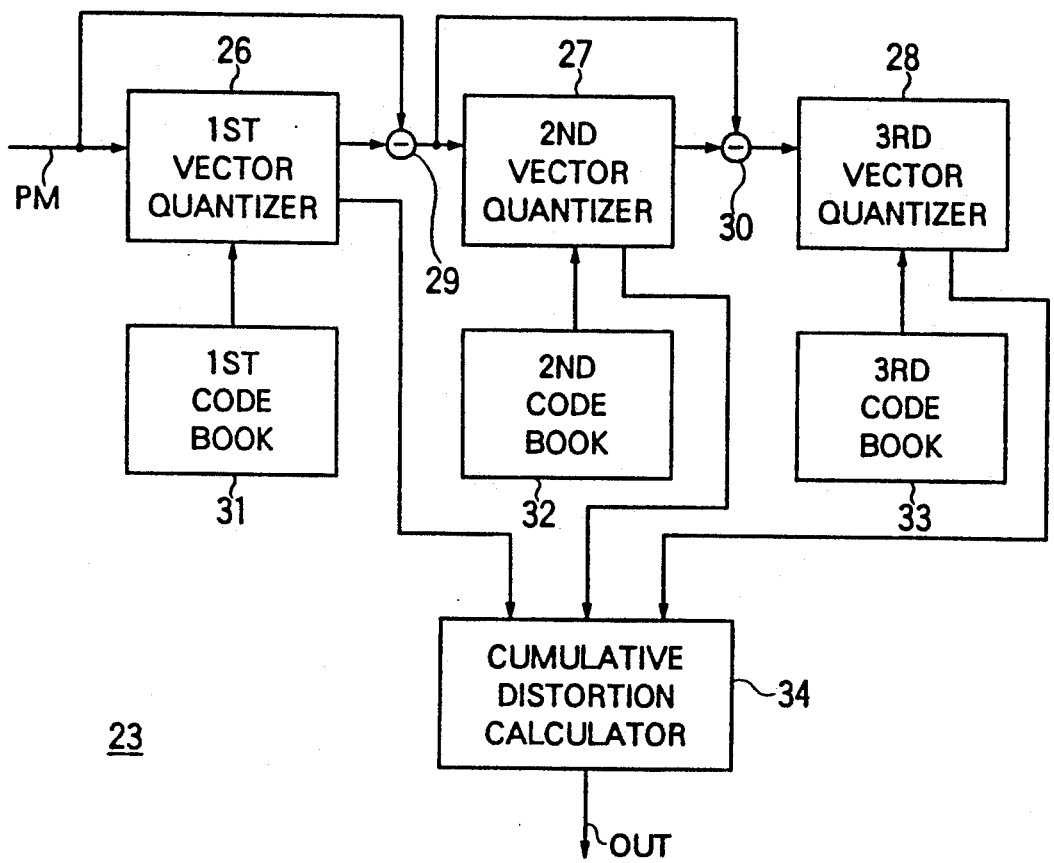
FIG. 2 is a block diagram of an LSP quantizer included in the speech parameter encoding device illustrated in FIG. 1.

Referring to FIG. 2 together with FIG. 1, the LSP quantizer 23 carries out vector quantization of the LSP coefficients PM and comprises first through third vector quantizers 26, 27, and 28 connected in cascade through first and second subtractors 29 and 30 located between the first and the second vector quantizers 26 and 27 and between the second and the third vector quantizers 27 and 28, respectively. As illustrated in FIG. 2, the first through the third vector quantizers 26 to 28 are connected to first through third code books 31, 32, and 33, respectively, on one hand and are also connected to a cumulative distortion calculator 34 on the other hand.

In the example being illustrated, the LSP coefficients are delivered at every frame to the first vector quantizer 26 to be subjected by the first vector quantizer 26 to vector quantization. In this event, the first code book 31 is formed by previously training a great number of LSP coefficient patterns. Such a training method may be a method which is disclosed by Linde, Buzo, and Gray in a paper which is entitled "An Algorithm for Vector Quantization Design" (IEEE Transactions on Communications, Vol. Com-28, No. 1, January 1980, pages 84–95) and which will be called Reference 5.

In any event, the first vector quantizer 26 calculates a predetermined number (M) of primary code vector candidates formed by the code vectors read out of the first code book 31. This shows that a combination of the first vector quantizer 26 and the first code book 31 will be called a first stage of vector quantization units. The primary code vector candidates are successively calculated in turn from a smallest one of vector quantization distortions. In this case, the vector quantization distortions are also calculated in connection with the primary code vector candidates.

Various kinds of distortion measures are known which are used to search the code vectors. In the illustrated example, it is assumed that square distances of the LSP coefficients are used as the distortion measures. Specifically, the square distances D1 at the first stage are given by:

$$D1 = \sum_{i=1}^{p} [LSP(i) - LSP'_j(i)]^2, \quad (1)$$

where LSP (i) represents an i-th one of input LSP coefficients; $LSP'_j(i)$, a j-th code vector which is stored in the first code book 31 and which is indicative of LSP coefficients; and j, a variable between 1 and $2^B$ (B is a bit number of the first code book 31).

The first subtractor 29 subtracts each of the code vector candidates, M in number, from the input LSP coefficients to calculate error signals between the primary code vector candidates and the input LSP coefficients. From this fact, it is readily understood that the first subtractor 29 successively supplies first through M-th ones of the error signals to the second vector quantizer 27.

The second vector quantizer 27 accesses the second code book 32 each time when the first through the M-th error signals are given to the second vector quantizer 27. Herein, it is to be noted that a combination of the second vector quantizer 27 and the second code book 32 may be referred to as a second stage of vector quantization units.

Thereafter, the second vector quantizer 27 searches for secondary code vectors in accordance with the following equation (2):

$$D_N = \sum_{i=1}^{p} [LSP_{ek}(i) - LSP'_j(i)]^2, \quad (2)$$

where $LSP_{ek}$ (i) represents one of the error signals calculated for a k-th one of the primary code vector candidates in the first vector quantizer 26; k is variable between 1 and M, both inclusive; and N is equal to two in the second stage. Thus, a predetermined number of secondary code vector candidates can be obtained from a smallest one of distortions in turn.

The second subtractor 30 and the third vector quantizer 28 are operable in manners similar to the first subtractor 29 and the second vector quantizer 27, respectively. It is assumed that the third vector quantizer 28 produces ternary code vector candidates. At any rate, a combination of the third vector quantizer 28 and the third code book 33 may be referred to as a third stage of the vector quantization units.

Herein, it is to be noted that the first through the third vector quantizers 26 to 28 supply the cumulative distortion calculator 34 with vector quantization distortions for the respective candidates calculated in the first through the third vector quantizers 26 to 28.

Specifically, the cumulative distortion calculator 34 calculates, as a cumulative distortion, a total $D_{AK}$ of the distortions sent from the first through the third vector quantizers 26 to 28. In this case, the total $D_{Ak}$ of the distortions is given by:

$$D_{AK} = \sum_{i=1}^{N} D_{iK} \quad (3)$$

Such a cumulative distortion is calculated in the cumulative distortion calculator 34 in connection with each of combinations of the primary, the secondary, and the ternary code vectors. Thereafter, the cumulative distortion calculator 34 selects, as an optimum combination of the code vectors, one of the combinations that minimizes the cumulative distortions. The optimum combination is produced from the cumulative distortion calculator 34 as a quantized value of the spectrum parameter and produced as the output signals OUT.

Figure 3:
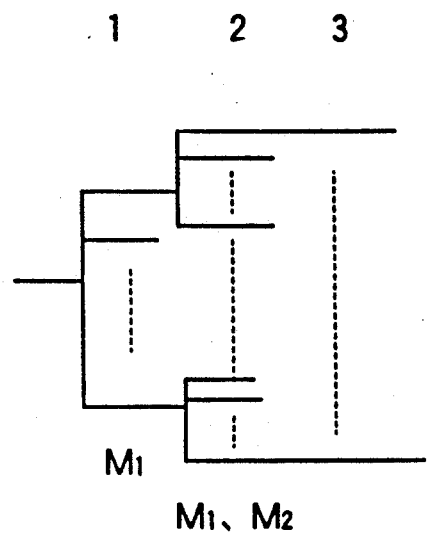
FIG. 3 is a diagram for use in illustrating an operation of the LSP quantizer shown in FIG. 2.

Referring to FIG. 3, the cumulative distortion calculator 34 arranges, like a tree, the code vector candidates which are calculated at every one of the first through the third vector quantizers 26 to 28. In FIG. 3, the code vector candidates of the first and the second vector quantizers 26 and 27 are assumed to be equal in number to M1 and M2, respectively. The cumulative distortion calculator 34 calculates the cumulative values $D_{AK}$ at each path of the tree in accordance with Equation 3 to select an optimum path which minimizes the cumulative distortions and which is specified by the optimum combination of the code vectors. The optimum combination of the code vectors is determined as the quantization value of the spectrum parameter, as mentioned before. Subsequently, the cumulative distortion calculator 34 produces, as the output signals OUT, indices representative of the code vectors of the optimum combination which are obtained from each stage of the vector quantizers 26 to 28.

From this fact, it is readily understood that each of the second and the third vector quantizers 27 and 28 quantizes each error signal sent from a preceding quantizer into the code vector, namely, a quantized vector signal and that the cumulative distortion calculator 34 calculates the cumulative distortions to select the optimum combination of the code vectors.

Alternatively, a vector quantization distortion of a last stage of the vector quantizers (for example, the third vector quantizer 28) may be calculated for each vector candidate and may be given by $D_{3K}$ which is provided by replacing N by 3 in Equation 2. An optimum one of combinations of the code vectors that minimizes the vector quantization distortions of the last stage may be selected as a quantization value of the spectrum parameter.

Figure 4:
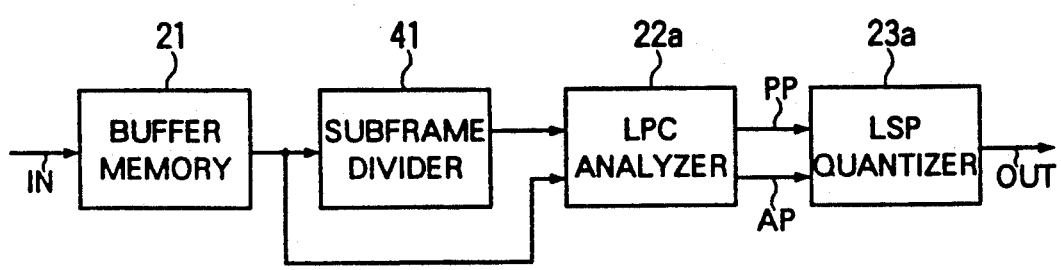
FIG. 4 is a block diagram of a speech parameter encoding device according to a second embodiment of this invention.

Referring to FIG. 4, a speech parameter encoding device according to a second embodiment of this invention is operable in accordance with another principle of this invention. An input speech signal IN is divided into a plurality of frames to be successively stored in a buffer memory 21 as a stored frame signal at every frame, like in FIG. 1. The frame may have a frame period equal to 20 milliseconds. Thereafter, the input speech signal IN is read out of the buffer memory 21 in the form of a readout speech signal at every frame. In the illustrated example, the readout speech signal is delivered to a subframe divider 41 on one hand and to a linear prediction coding (LPC) analyzer 22a on the other hand. In the subframe divider 41, each frame is subdivided into a plurality of subframes each of which may have a subframe period of, for example, 5 milliseconds. As a result, the readout speech signal is sent from the subframe divider 41 to the LPC analyzer 22a at every subframe. The readout speech signal which lasts for each subframe will be called a subframe speech signal.

In FIG. 4, the LPC analyzer 22a carries out an LPC analysis at every subframe. In other words, the subframe speech signal is subjected to the LPC analysis by the LPC analyzer 22a to calculate speech parameters. In the illustrated example, the speech parameters may be, for example, LSP coefficients like in FIG. 2. The LPC analyzer 22a produces, as primary LSP coefficients PP, either all of LSP coefficients within each frame or only LSP coefficients in a predetermined subframe (for example, third subframe). In addition, additional LSP coefficients AP are calculated in connection with adjacent subframes which are adjacent to the predetermined subframe and which may be, for example, second and fourth ones of the subframes. The additional LSP coefficients AP are supplied from the LPC analyzer 22a to a line spectrum pair (LSP) quantizer 23a together with the primary LSP coefficients PP.

Figure 5:
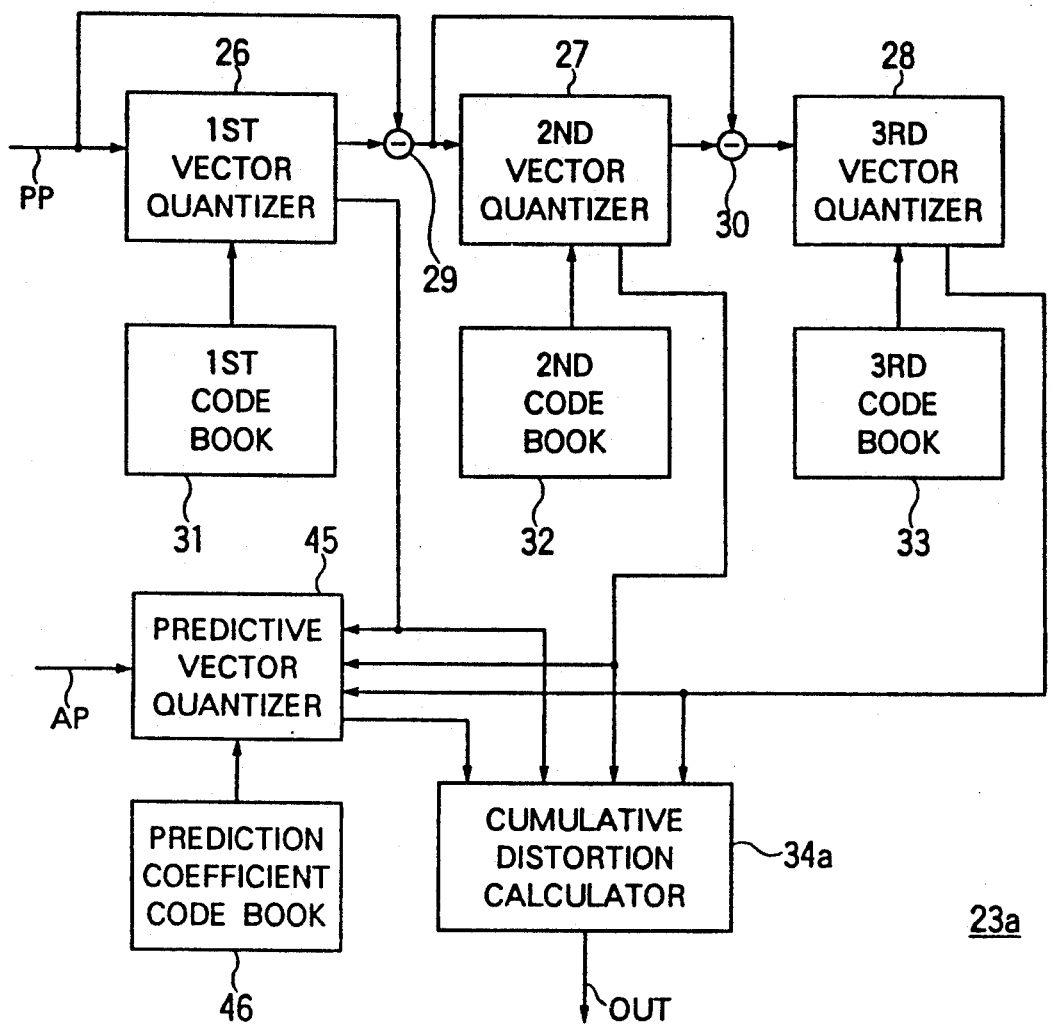
FIG. 5 is a block diagram of an LSP quantizer included in the speech parameter encoding device illustrated in FIG. 5.

Referring to FIG. 5 along with FIG. 4, the LSP quantizer 23a is similar in structure to that illustrated in FIG. 2 except that a predictive vector quantizer 45 and a prediction coefficient code book 46 are included in the LSP quantizer 23a. In FIG. 5, the primary and the additional LSP coefficients PP and AP are supplied with the first vector quantizer 26 and the predictive vector quantizer 45, respectively. The primary LSP coefficients PP are processed by the first through the third vector quantizers 26 to 28, the first and the second subtractors 29 and 30, and the first through the third code books 31 to 33 in the manner described in conjunction with FIG. 2. In this connection, the first through the third vector quantizers 26 to 28 supply the cumulative distortion calculator 34 with the primary, the secondary, and the ternary code vector candidates, respectively, like in FIG. 2. The primary and the secondary code vector candidates are equal in number to M1 and M2, respectively.

In addition, the primary, the secondary, and the ternary code vector candidates are supplied to the predictive vector quantizer 45 also in the illustrated example.

Now, the predictive vector quantizer 45 cooperates with the prediction coefficient code book 46 to predict LSP coefficients in the adjacent subframes on the basis of the primary, the secondary, and the ternary code vector candidates and to calculate a predictive quantization distortion $D_{Pr}$ which is given by:

$$D_{Pr} = \sum_{i=1}^{P} [LSP(i) - LSP'_k(i)A_r(i)]^2, \quad (4)$$

where $LSP'_k(i)$ is representative of a k-th one of the code vector candidates calculated from the first vector quantizer 26 to the third vector quantizer 28 and $A_r(i)$ is representative of an r-th one of the code vectors stored in the predictive code book 46.

Subsequently, the predictive vector quantizer 45 calculates sums D of the cumulative distortions $D_{AK}$ and the predictive quantization distortion $D_{Pr}$ in accordance with the following equation.

$$D = D_{AK} + D_{Pr} \quad (5)$$

Thus, the above-mentioned procedure is repeated at every one of the subframes to determine the code vector candidates and to successively quantize the LSP coefficients at every subframe in a manner to be described hereinunder.

More specifically, the predictive vector quantizer 45 at first determines the k-th code vector candidate $LSP'_k(i)$ in a following manner from the code vector candidates obtained when LSP coefficients are subjected to vector quantization. At first, the predictive vector quantizer 45 arranges, like a tree, the code vector candidates sent from each of the first through the third vector quantizers 26 to 28, as illustrated in FIG. 3. The primary and the secondary code vector candidates are assumed to be equal in number to M1 and M2, respectively. As shown in FIG. 3, such an arrangement is formed by a plurality of paths extended from the code vector candidates of the first vector quantizer 26 to those of the third vector quantizer 28. The k-th code vector candidate $LSP'_k(i)$ is locally decoded within the predictive vector quantizer 45 at every one of the paths and may be therefore called a local decoded LSP coefficient. In this event, the local decoded LSP coefficient $LSP'_k(i)$ is given by:

$$LSP'_k(i) = LSP'_{k1}(i) + LSP'_{k2}(i) + LSP'_{k3}(i), \quad (6)$$

where k1, k2, and k3 represent indices of the code vectors selected by the first, the second, and the third vector quantizers 26, 27, and 28, respectively; k1 is variable between 1 and M1, both inclusive; k2 is variable between 1 and M2; and k3 is equal to unity. In this connection, it is readily understood that k is variable between 1 and M1×M2, both inclusive.

Subsequently, the predictive vector quantizer 45 reads prediction coefficients out of the prediction coefficient code book 46 to predict LSP coefficients as predictive LSP coefficients in each subframe by the use of the local decoded LSP coefficients $LSP'_k(i)$. Moreover, the predictive vector quantizer 45 calculates the predictive quantization distortion $D_{Pr}$ for each of the code vector candidates in accordance with Equation 4 to successively supply the cumulative distortion calculator 34a with the predictive quantization distortions $D_{Pr}$.

The cumulative distortion calculator 34a at first calculates the cumulative distortions $D_{AK}$ for the respective paths and thereafter calculates sums D of the cumulative distortions $D_{AK}$ and the predictive quantization distortions $D_{Pr}$ given from the predictive vector quantizer 45, in accordance with Equation 5. In addition, calculations are made in the cumulative distortion calculator 34a to obtain an optimum combination of the paths specified by the predictive code vectors such that the sum D becomes minimum. Thereafter, the indices which specify the optimum combination are produced as the quantization value of the LSP coefficients, namely, the output signals OUT.

In order to quantize the LSP coefficients at every subframe, an interpolation coefficient code book may be used instead of the prediction coefficient code book 46 mentioned above.

When such an interpolation coefficient code book is used, interpolation coefficients $b_r$ are previously calculated and stored into the interpolation coefficient code book on the assumption that the LSP coefficients in each of the subframes are expressed by linearly interpolating the LSP coefficients of the adjacent subframes.

In this event, quantization distortions $D_{IL}$ due to interpolation are calculated in accordance with the following equation (7) and will be referred to as interpolation distortions.

$$D_{IL} = \sum_{i=1}^{P} [(LSP(i) - LSP_k^L(i)) - b_r(LSP'^{L-1}(i) - LSP_k^L(i))]^2, \quad (7)$$

where k is variable between 1 and M, both inclusive; r is also variable between 1 and $2^{BB}$; $LSP'_k{}^L(i)$ is representative of a k-th one of the code vector candidates obtained when an i-th one of the LSP coefficients in a current frame is subjected to vector quantization; $LSP'^{L-1}(i)$ is representative of a vector quantization value of LSP coefficients calculated in a previous frame located one frame before the current frame.

The interpolation coefficient code book can be prepared by calculating interpolation coefficients $b_r$ so that Equation 7 becomes minimum for a training signal at every subframe.

Such interpolation coefficients $b_r$ are designed in accordance with a method described in Reference 5. Thus, the interpolation coefficient code book is prepared.

Thereafter, sums D of the interpolation distortions $D_{IL}$ and the cumulative distortions are calculated by the use of the following equation.

$$D = D_{AK} + D_{IL}. \quad (8)$$

A combination of the code vector and the interpolation coefficient code vector which minimizes the sums D is selected. This means that the LSP coefficients are quantized at every subframe to be produced as the output signals OUT.

Figure 6:
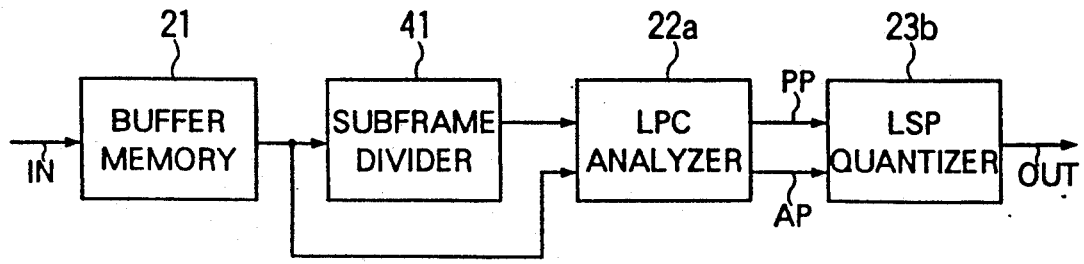
FIG. 6 is a block diagram of a speech parameter encoding device according to a third embodiment of this invention.
Figure 7:
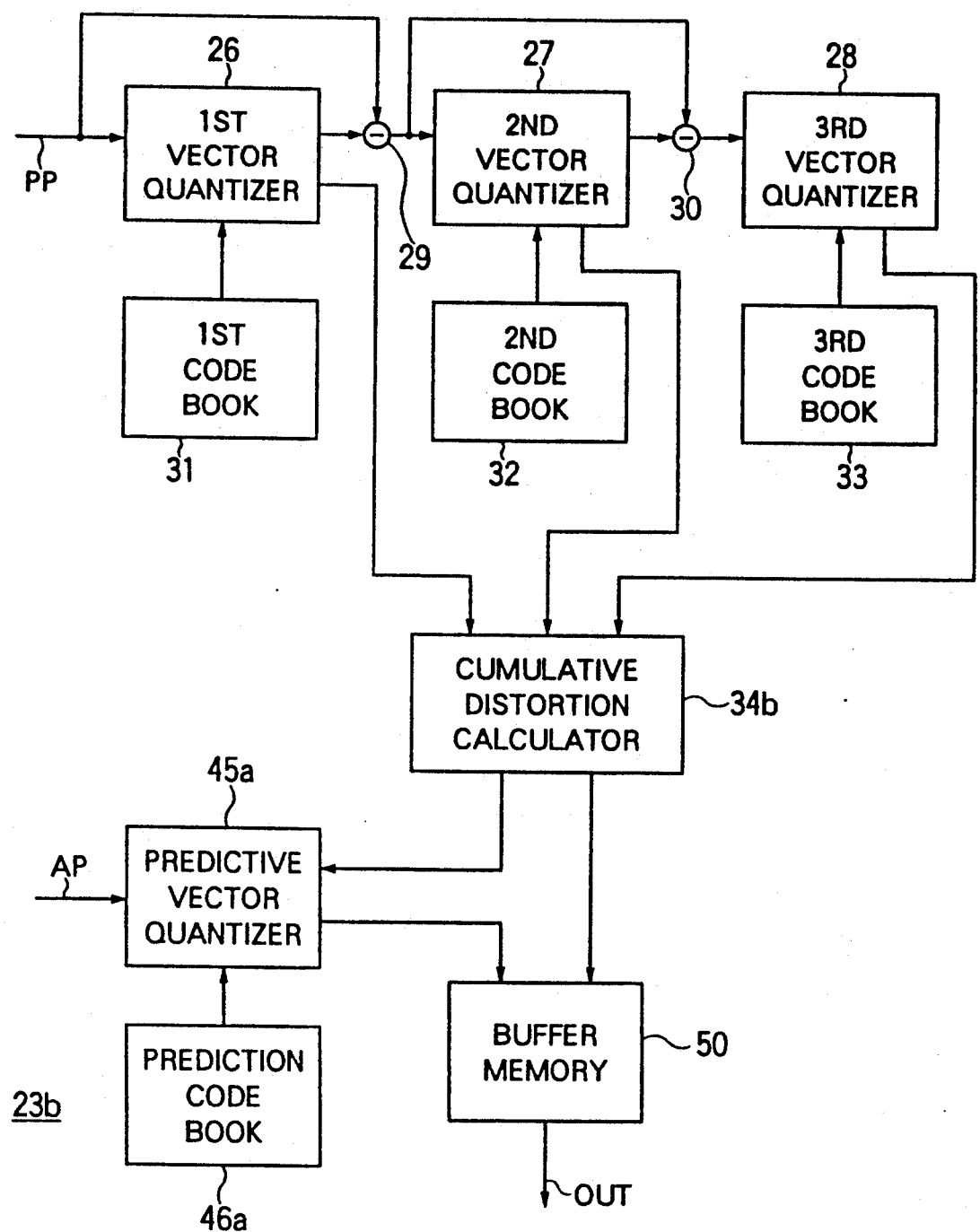
FIG. 7 is a block diagram of an LSP quantizer included in the speech parameter encoding device illustrated in FIG. 6.

Referring to FIGS. 6 and 7, a speech parameter encoding device according to a third embodiment of this invention is similar in structure to that illustrated in FIGS. 4 and 5 except that an LSP quantizer is operable in a manner different from the LSP quantizer 23a shown in FIG. 5. In this connection, the LSP quantizer is depicted at 23b in FIGS. 6 and 7.

In FIG. 7, the illustrated LSP quantizer 23b comprises a buffer memory 50 connected to a predictive vector quantizer 45a and a cumulative distortion calculator 34b which are operable in a manner to be described later in detail. Like in FIG. 5, the primary and the additional LSP coefficients PP and AP are supplied to the first vector quantizer 26 and the predictive vector quantizer 45a, respectively. The predictive vector quantizer 45a is operable in cooperation with a prediction code book 46a in a manner similar to that illustrated in FIG. 5.

The illustrated cumulative distortion calculator 34b is supplied from the first through the third vector quantizers 26 to 28 with the code primary, the secondary, and the ternary vector candidates which are equal in number to M1, M2, and M3, respectively. The cumulative distortion calculator 34b arranges, like a tree, the code vector candidates, as shown in FIG. 3, and calculates the cumulative distortions $D_{AK}$ over a whole of the vector quantizers 26 to 28 for the respective paths in accordance with Equation 3. Thereafter, the cumulative distortion calculator 34b determines, as a quantization value of a spectrum parameter, one of the paths that is specified by a combination of the code vectors and that minimizes the cumulative distortions. The quantization value is delivered from the cumulative distortion calculator 34b to the predictive vector quantizer 45a. In addition, the cumulative distortion calculator 34b supplies the buffer memory 50 with an index which is representative of the combination of the code vectors determined by the cumulative distortion calculator 34b.

The predictive vector quantizer 45a calculates the local decoded LSP coefficients for the respective paths (shown in FIG. 3) in accordance with Equation 6. Subsequently, the predictive vector quantizer 45a reads a prediction coefficient out of the prediction vector code book 46a to predict a predictive LSP coefficient by the use of the local decoded LSP coefficients given by Equation 7. Furthermore, predictive quantization distortions $D_{Pr}$ are calculated on the basis of Equation 4 for the respective candidates of the local decoded LSP coefficients and are supplied to the buffer memory 50 in the form of an index which represents one of the predictive code vectors that minimizes the predictive quantization distortions.

The buffer memory 50 produces, as the output signals, the index representative of the selected code vector of the LSP coefficients of each frame, together with the index representative of the selected predictive code vector of the LSP coefficients in each frame.

According to the first through the third embodiments, it is possible to transmit the speech signal at a bit rate between 1 kb/s and 1.25 kb/s, namely, at a bit number between 20 bits/frame and 25 bits/frame.

Figure 8:
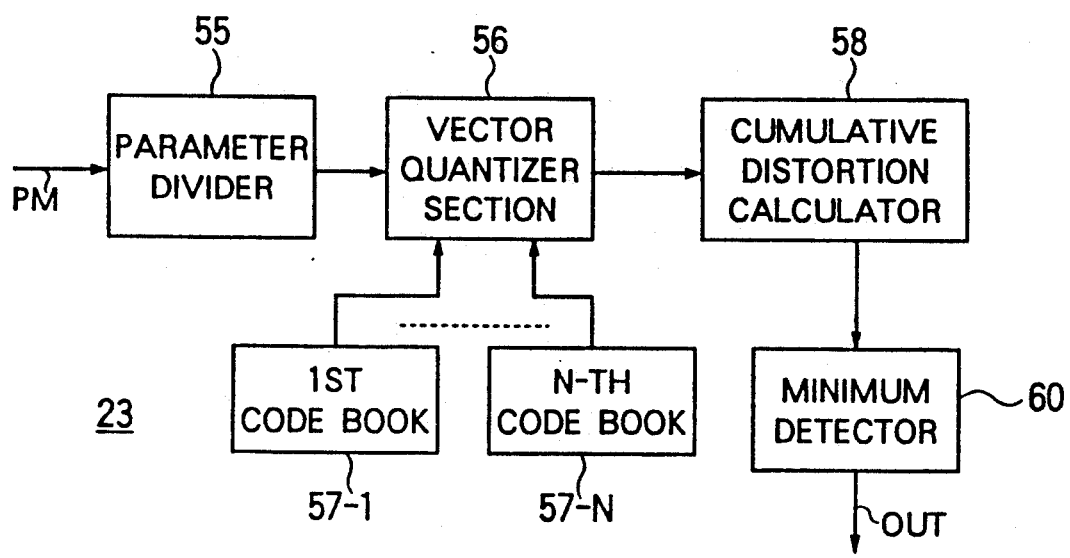
FIG. 8 is a block diagram of an LSP quantizer for use in a speech parameter encoding device according to a fourth embodiment of this invention.

Referring to FIG. 8 together with FIG. 1, a speech parameter encoding device according to a fourth embodiment of this invention is formed by a buffer memory 21, an LPC analyzer 22, and an LSP quantizer 23, like in the first embodiment, although the LSP quantizer 23 illustrated in FIG. 8 is different in structure and operation from that illustrated in FIG. 2. In this connection, description will be mainly made about the LSP quantizer 23 shown in FIG. 8.

In FIG. 8, the illustrated LSP quantizer 23 is supplied from the LPC analyzer 22 with the LSP coefficients PM at every frame. In the example being illustrated, the LSP quantizer 23 is given a predetermined order P of the LSP coefficients PM. For example, P may be equal to 10. At any rate, the LSP coefficients PM are sent to a parameter divider 55 of the LSP quantizer 23. The parameter divider 55 divides the LSP coefficients into a preselected number N of coefficient groups each of which is composed of K dimensions of the coefficient where K is smaller than P. Each coefficient group is successively supplied to a vector quantizer section 56 connected to first through N-th code books 57-1 to 57-N corresponding to the preselected number N. Thus, each of the first through N-th code books 57-1 to 57-N is previously structured at every coefficient group of K dimensions and stores a plurality of code vectors the number of which is determined by a predetermined number of bits.

In the illustrated example, each of the code books may store code vectors in correspondence to each of the coefficient groups but is assumed to store, as the code vectors, difference values between adjacent ones of the orders of the LSP coefficients by using a strong correlation between the adjacent orders of the LSP coefficients. With this structure, it is possible to effectively store the code vectors in each code book.

When such code vectors are stored in the code books, an i-th one of the LSP coefficients is given by:

$$\omega'_i = \omega'_{i-1} + \Delta\omega'_{ij}, \quad (9)$$

where $\Delta\omega'_{ij}$ is representative of a j-th one of the code vectors included in the code book.

Herein, each of the first through N-th code books 57-1 to 57-N can be formed by training by the use of the difference values between the orders at each of the K dimensions of the LSP coefficients. Such a training method is described in Reference 5.

The illustrated vector quantizer section 56 calculates quantization distortions D given by:

$$D = \sum_i [\omega_i - \omega'_{ij}]^2, \qquad (10)$$

where $\omega_i$ is representative of an i-th order of the LSP coefficients given to the vector quantizer section 56 and $\omega'_{ij}$ is representative of an i-th order of the LSP coefficients represented by a j-th one of the code vectors. The vector quantizer section 56 produces, for every one of the K dimensions, code vector candidates which minimize Equation 10 and which are equal in number to M and which are successively arranged from a smallest one to a largest one in turn.

The code vector candidates, M in number, are successively sent to a cumulative distortion calculator 58 in turn from the smallest code vector candidate. Cumulative distortions E are calculated as regards all combinations of the code vector candidates in accordance with the following equation:

$$E = \sum_{i=1}^{N} Di. \qquad (11)$$

The cumulative distortions E are supplied to a minimum detector 60 to detect one of the combinations that minimizes the cumulative distortions and to produce, as a minimum combination, the combination of the code vectors for a minimum one of the cumulative distortions. Thereafter, an index of the minimum combination is selected by the minimum detector 60 and produced as the output signals OUT.

Figure 9:
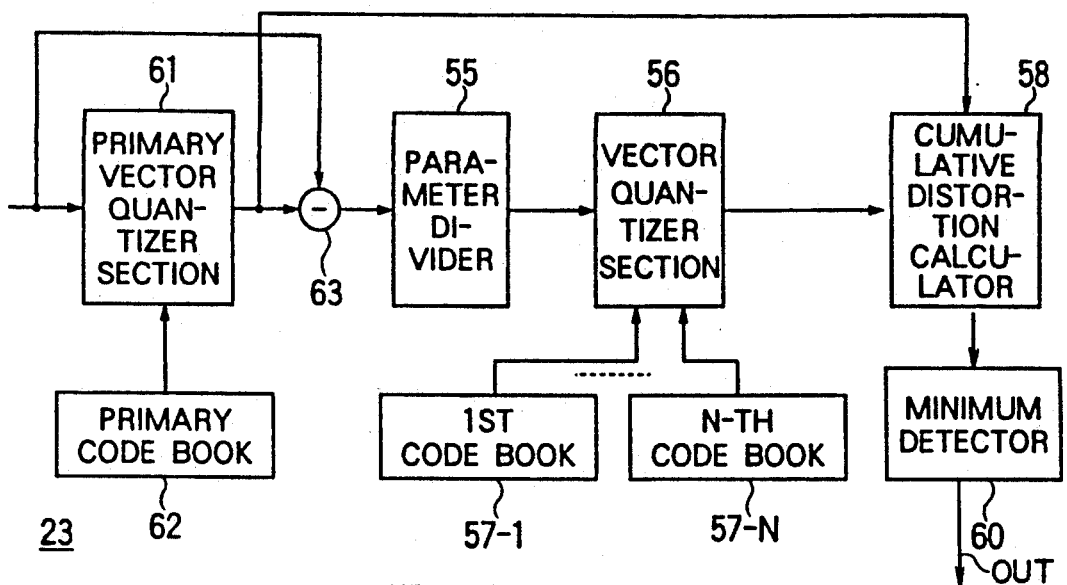
FIG. 9 is a block diagram of an LSP quantizer for use in a speech parameter encoding device according to a fifth embodiment of this invention.

Referring to FIG. 9, a speech parameter encoding device according to a fifth embodiment of this invention is specified by an LSP quantizer 23 which comprises similar parts designated in FIG. 8 by like reference numerals. In addition, the illustrated LSP quantizer 23 comprises a primary or previous vector quantizer section 61, a primary code book 62, and a subtractor 63 prior to the parameter divider 55. Thus, the illustrated LSP quantizer 23 comprises two stages of the vector quantizer sections 61 and 56 connected in cascade through the subtractor 63, although the number of the stages may not be always restricted to two.

In FIG. 9, the primary vector quantizer section 61 is supplied with the predetermined order P of the spectrum parameter, like in FIG. 8, and is operable in cooperation with the primary code book 62. The primary vector quantizer section 61 quantizes the spectrum parameter by the use of the primary code book 62 into quantized signals. More specifically, the primary vector quantizer section 61 calculates the quantization distortion for each of the code vectors read out of the primary code book 62, in accordance with Equation 10. Thereafter, code vector candidates, M in number, are successively produced from a smallest one in turn by the primary vector quantizer section 61 and sent to both the subtractor 63 and the cumulative distortion calculator 58.

The subtractor 63 calculates error signals of P orders between the code vector candidates and the LSP coefficients PM in parallel to supply the error signals to the parameter divider 55. The parameter divider 55 divides the error signals of P orders into a plurality of groups each of which is composed of K dimensions, where K is smaller than P, as mentioned in conjunction with FIG. 8.

The vector quantizer section 56 cooperates with the first through the N-th code books 57-1 to 57-N each of which stores difference values between adjacent ones of the orders at every one of the K dimensions, as mentioned in FIG. 8. Specifically, the vector quantizer section 56 carries out vector quantization of the error signals at every one of the K dimensions by the use of the first through N-th code books 57-1 to 57-N in accordance with Equations 9 and 10. Subsequently, the code vectors, M in number, for every one of the K dimensions are successively produced from a smallest one, as mentioned in conjunction with the vector quantizer section 56, and sent to the cumulative distortion calculator 58.

The cumulative distortion calculator 58 cumulates quantization distortions as regards all combinations of the code vector candidates, M in number, of the primary vector quantizer section 61 and the candidates calculated at every one of the K dimensions by the vector quantizer section 56. The minimum detector 60 obtains a specific one of the combinations of the candidates that minimizes the cumulative distortions. Thereafter, the minimum detector 60 produces, as the output signals OUT, a combination of indices representative of the specific combination of the candidates.

Figure 10:
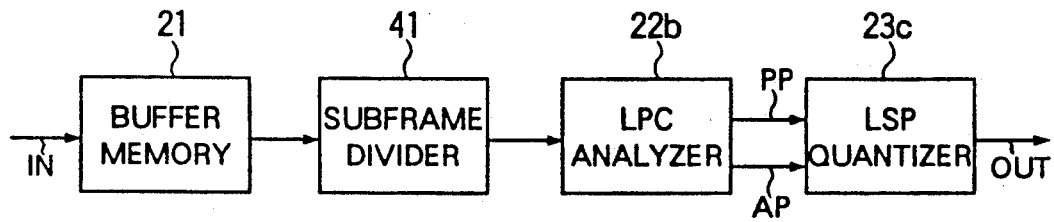
FIG. 10 is a block diagram of a speech parameter encoding device according to a sixth embodiment of this invention.

Referring to FIG. 10, a speech parameter encoding device according to a sixth embodiment of this invention comprises a buffer memory 21, a subframe divider 41, an LPC analyzer 22b, and an LSP quantizer 23c, like in FIGS. 4 and 6, although the LPC analyzer 22b and the LSP quantizer 23c are somewhat different from those illustrated in FIGS. 4 and 6. The input speech signal IN is supplied to and stored in the buffer memory 21 at every frame which has a frame period of, for example, 30–40 milliseconds. The subframe divider 41 divides each frame into a plurality of subframes each of which has a subframe period of, for example, 5–8 milliseconds.

Thus, the input speech signal is divided by the subframe divider 41 into a plurality of subframe speech signals located within the respective subframes. Each of the subframe speech signals is sent to the LPC analyzer 22b.

As illustrated in FIG. 10, the LPC analyzer 22b is given only the subframe speech signals, which is different from FIGS. 4 and 6. In this connection, the LPC analyzer 22b carries out an LPC analysis only about at least one of the subframe speech signals. In the illustrated example, the LPC analysis is carried out in the LPC analyzer 22b for two of the subframes in each frame.

In other words, it is assumed that the spectrum parameter is calculated from two subframes which may be, for example, second and fourth subframes when each frame is subdivided into first through fifth subframes. In this event, the spectrum parameters of the second and the fourth subframes will be referred to as primary and additional spectrum parameters PP and AP, respectively. Each of the primary and the additional spectrum parameters PP and AP is assumed to be composed of LSP coefficients of K orders in FIG. 10.

Figure 11:
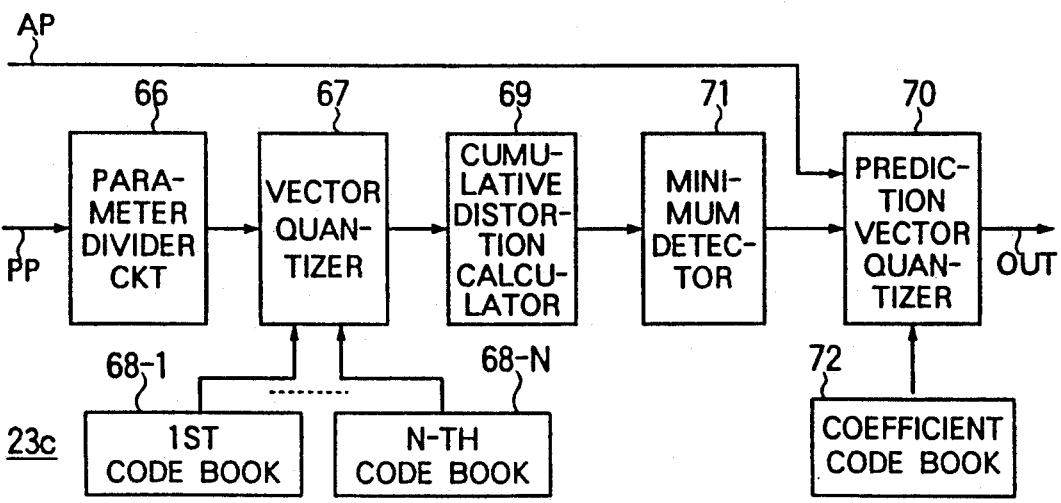
FIG. 11 is a block diagram of an LSP quantizer for use in the speech parameter encoding device illustrated in FIG. 10.

Referring to FIG. 11 in addition to FIG. 10, the primary and the additional spectrum parameters PP and AP are delivered to the LSP quantizer 23c and received by a parameter divider circuit 66 and a prediction vector quartizer 70, respectively. The parameter divider circuit 66 divides the LSP coefficients of the primary speech parameter PP into a predetermined number N of groups each of which is composed of K dimensions.

The LSP coefficients are supplied to a vector quantizer 67 which cooperates with first through N-th code books 68-1 to 68-N, like in FIG. 9. Each of the first through the N-th code books 68-1 to 68-N is previously structured for the K dimensions of each group by training in a known manner. At any rate, each of the first through the N-th code books 68-1 to 68-N stores a plurality of code vectors the number of which is determined by a predetermined bit number L and which is equal to $2^L$. Like in FIG. 9, each of the code vectors is representative of a difference value between two adjacent ones of the orders of the LSP coefficients. When such a code vector is used, an i-th order of the LSP coefficients is given by:

$$\omega'_i = \omega'_{i-1} + \Delta\omega'_i. \quad (12)$$

The above-mentioned code books 68-1 to 68-N can be formed in the manner mentioned in Reference 5 by using the difference values between the orders as training signals.

Now, the vector quantizer 67 calculates a quantization distortion for each of the K dimensions in accordance with Equation 13 to produce code vector candidates, M in number, for each of the K dimensions from a smallest one of the candidates in turn. For example, when first through M-th candidates are calculated for a first set of the K dimensions, LSP coefficients are represented by the use of the second code book 68-2 for the following set of the K dimensions by using the first through the M-th candidates as initial values. Thereafter, the vector quantizer 67 calculates quantization distortions in accordance with Equation 12 and determine candidates, M in number, from a smallest one in turn. Similar operation is repeated N times by the vector quantizer 67. Thus, the vector quantizer 67 successively supplies a cumulative distortion calculator 69 with the candidates, M in number, for the respective K dimensions in the form of code vector candidates.

The cumulative distortion calculator 69 calculates cumulative distortions E for all combinations of the code vectors, M in number, given at every one of the K dimensions. In this case, the cumulative distortions E are given by:

$$E = \sum_{i=1}^{N} D_i \quad (13)$$

The cumulative distortions E are sent to a minimum detector 71 to calculate a minimum combination which minimizes the cumulative distortions E. Subsequently, the minimum combination of the code vectors is sent from the minimum detector 71 to the prediction vector quantizer 67 which is operable in cooperation with a coefficient code book 72.

The prediction vector quantizer 67 calculates predictive LSP coefficients of the fourth subframe by the use of the minimum combination and coefficient code vectors sent from the coefficient code book 72. Thereafter, the prediction vector quantizer 70 calculates a minimum one of the coefficient code vectors from the LSP coefficients of the additional LSP parameter AP and the predictive LSP coefficients in a manner to be described later to produce the minimum coefficient code vector and the code vector sent from the minimum detector 71 as quantization values of the spectrum parameter in the second and the fourth subframes. The quantization values appear as the output signals OUT.

Figure 12:
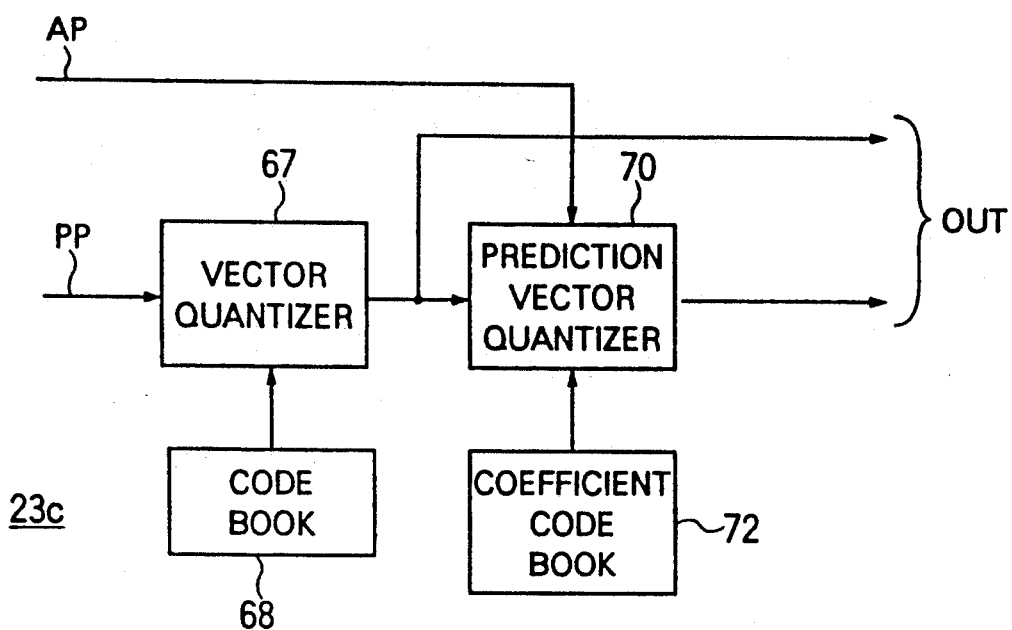
FIG. 12 is a block diagram of a modification of an LSP parameter illustrated in FIG. 11.

Referring to FIG. 12, a modification of the speech parameter encoding device according to the sixth embodiment of this invention comprises similar parts designated by like reference numerals in FIG. 11. As readily understood from FIG. 12, the primary and the additional spectrum parameters PP and AP are directly supplied to the vector quantizer 67 and the prediction vector quantizer 70, respectively. Like in FIG. 11, each of the primary and the additional spectrum parameters PP and AP is composed of the LSP coefficients. The illustrated vector quantizer 67 carries out vector quantization of the primary spectrum parameter PP by the use of the code book 68 which stores code vectors. The vector quantizer 67 is operated on the basis of a predetermined distortion measure which may be, for example, a square distance between LSP coefficients. The square distance is given by:

$$D_i = \sum_{i=1}^{P} [LSP(i) - LSP_j(i)]^2, \quad (14)$$

where LSP(i) represents an i-th LSP coefficient of the primary spectrum parameter PP and LSP'$_j$(i) represents a j-th one of the code vectors stored in the code book 68. In addition, j is variable between 1 and $2^B$ where B is a bit number of the code book 67. At any rate, the vector quantizer 67 searches for a specific one of the code vectors that minimizes a value of Equation 14. The specific code vector is produced as a part of the output signals on one hand and is delivered to the prediction vector quantizer 70 on the other hand.

Supplied with the specific code vector and the additional spectrum parameter AP, the prediction vector quantizer 70 calculates predictive LSP coefficients for the additional spectrum parameter AP and thereafter calculates quantization distortions Dr between the predictive LSP coefficients and LSP coefficients of the additional spectrum parameter AP. To this end, the prediction vector quantizer 70 cooperates with the coefficient code book 72 in a manner similar to that illustrated in FIG. 11. The quantization distortions Dr is given by:

$$Dr = \sum_{i=1}^{P} [LSP(i) - LSP'(i) Ar(i)]^2, \quad (15)$$

where r is variable between 1 and $2^{BB}$, both inclusive, and LSP(i) represents the LSP coefficients of the additional spectrum parameter AP; LSP'(i), an i-th one of the code vectors calculated by the vector quantizer 67; Ar(i), an r-th one of the coefficient code vectors read out of the code book 68; where in turn BB is a bit number of the coefficient code book 72.

The prediction vector quantizer 70 obtains a particular one of the coefficient code vectors that minimizes Equation 15 and produces the particular coefficient code vector as another part of the output signals OUT.

Figure 13:
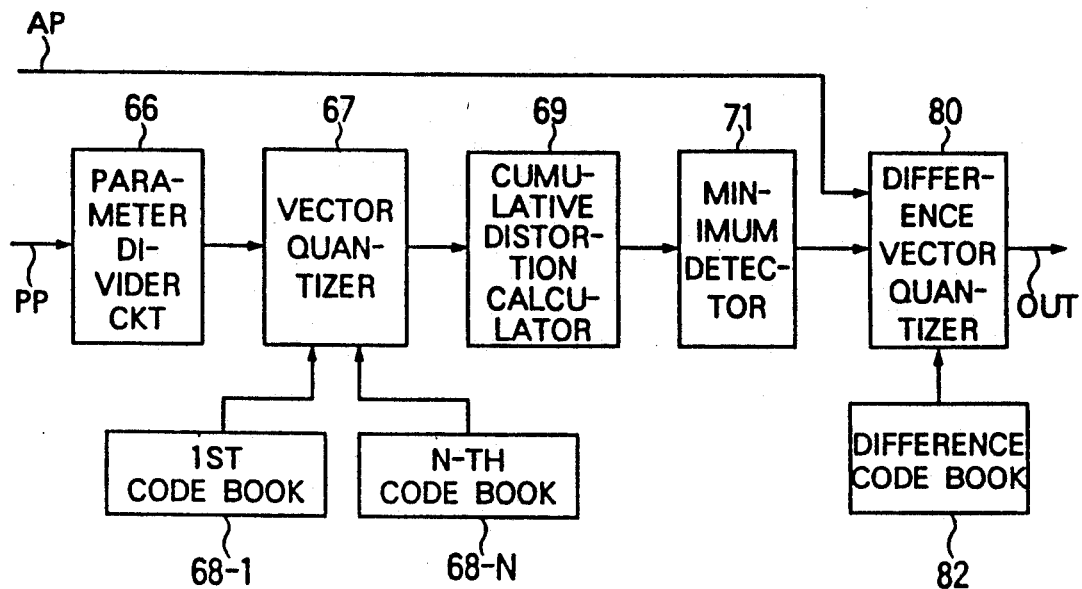
FIG. 13 is a block diagram of an LSP quantizer for use in a speech parameter encoding device according to a seventh embodiment of this invention.

Referring to FIG. 13, a speech parameter encoding device according to a seventh embodiment of this invention is similar to that illustrated in FIG. 11 except that the prediction vector quantizer 70 and the coefficient code book 72 of FIG. 11 are replaced by a difference vector quantizer 80 and a difference code book 82, respectively. The difference vector quantizer 80 calculates differences between the LSP coefficients of the additional spectrum parameter AP and the specific code vector sent from the minimum detector 71 to produce difference signals representative of the differences. The difference signals are subjected to vector quantization by the use of the difference code book 82. A particular one of the code vectors that minimizes quantization distortions is produced together with the specific code vector as the output signals.

Figure 14:
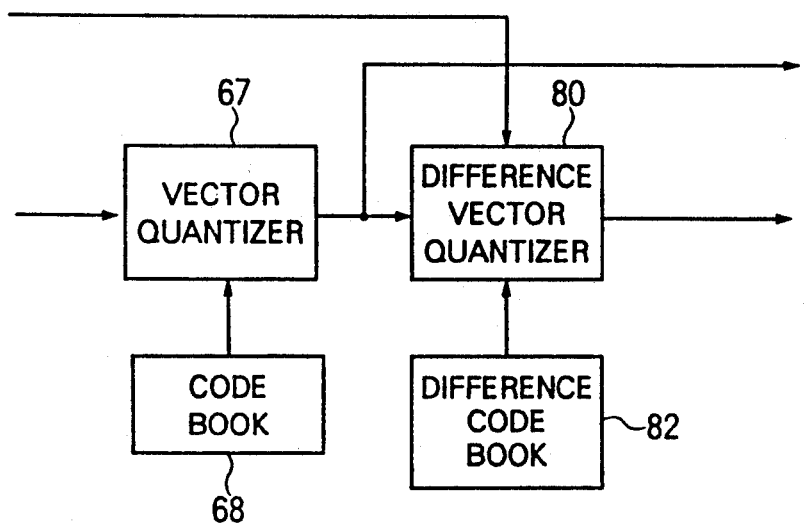
FIG. 14 is a block diagram of a modification of the LSP quantizer illustrated in FIG. 13.

Referring to FIG. 14, a modification of the speech parameter encoding device according to the seventh embodiment of this invention is similar to that illustrated in FIG. 12 except that the difference vector quantizer 80 and the difference code book 82 are substituted for the prediction vector quantizer 70 and the coefficient code book 72 illustrated in FIG. 12, respectively. The illustrated difference vector quantizer 80 calculates differences LSPe between the LSP coefficients of the additional spectrum parameter AP and vector quantized signals sent form the vector quantizer 67 in accordance with the following equation.

$$LSPe(i) = LSP(i) - B\,LSP(i), \qquad (16)$$

where B is a positive constant equal to or smaller than unity.

Herein, it is assumed that B is equal to unity. In this case, the differences LSPe are subjected to vector quantization by the use of the difference code book 82 and a particular one of the code vectors that minimizes quantization distortions is selected by the difference vector quantizer 80 and is produced as a part of the output signals OUT.

While this invention has thus far been described in conjunction with several embodiments thereof, it will readily be possible for those skilled in the art to put this invention into practice in various other manners. For example, it is possible to use a wide variety of known measures except the square distance to search for code vectors of LSP coefficients. For instance, a perceptually weighted square distance may be calculated as known in the art. Such a square distance is calculated in the form of cepstrum coefficients in a paper which is contributed by M. Honda to Acoustical Society of Japan and which is entitled "Vector quantization of LPC parameters using weighted spectral distortion measure" (pages 195-196, 1989). In addition, PARCOR, LAR, cepstrum coefficients which are known in the art may be used instead of the LSP coefficients.

In the first through the third embodiments of this invention, more than three stages of the vector quantizers may be used to carry out vector quantization of the LSP coefficients of each frame.

When the code vector candidates are calculated which are equal in number to M1 and M2 at the first and the second stages, the code vector candidates are exponentially increased to M1×M2 at the third stage. It is possible to avoid an increase of the code vector candidates by calculating cumulative distortions in each of the stages except the first stage and by carrying out pruning with a preselected number of the cumulative distortions alone left from a smallest one of the cumulative distortions when the code vector candidates reach to a prescribed number at every one of the stages. With this structure, not only the code vector candidates but also an amount of calculations can be reduced in comparison with the embodiments, although performance is somewhat lowered.

The code vector candidates may be arranged like a trellis instead of the tree illustrated in FIG. 3. Selection of the optimum combination of the code vector candidates may be carried out by the use of a known high speed calculation method, for example, a dynamic programming method, a viterbi calculation method.

A code book may be made for a combination of a plurality of subframes, which is different from each embodiment wherein each code book may be made for each subframe. Alternatively, a matrix code book may be made in accordance with a method which is disclosed in a paper that is contributed by C. Tsao et al to IEEE Trans. ASSP, pages 537-545, in 1985 and which is entitled "Matrix quantized design for LPC speech using the generalized Lloyd algorithm". When such a matrix code book is used, a plurality of subframes are collectively represented by code vectors. This results in a reduction of bits necessary for transmission of prediction or interpolation coefficient code vectors.

Either a tree search type or a lattice search type may be used as a vector quantizer instead of a total search type so as to reduce an amount of calculations necessary for searching for the code vectors.

In FIGS. 11 and 13, the minimum detector 71 may be located after the prediction vector quantizer 70 or the difference vector quantizer 80 so as to calculate a cumulative distortion, to carry out quantization of the cumulative distortion, and to thereafter minimize the cumulative distortion. With this structure, it is possible to improve performance, although an amount of calculation is increased.

What is claimed is:

1. A speech parameter encoding method of encoding a speech signal into a sequence of output encoded signals, said method comprising the steps of:
    dividing said speech signal into a sequence of partial speech signals each of which has a predetermined period;
    successively calculating a spectrum parameter at every one of said partial speech signals;
    successively giving said spectrum parameter at a predetermined one of said partial speech signals to a vector quantizer circuit which comprises first through last stages of vector quantization units connected in cascade from the first stage to the last stage through a subtractor interposed between two adjacent ones of said first through said last stages of the vector quantization units, each of said vector quantization units carrying out vector quantization by the use of a code book which stores a plurality of code vectors determined in relation to quantization distortions from said spectrum parameter while said subtractor produces error signals;
    calculating said first set of the code vector candidates in said first stage of the vector quantization units by the use of the code book of the first stage in consideration of said quantization distortions between said spectrum parameter and each of said code vectors stored in the code book of the first stage;
    calculating the error signals representative of differences between said first set of the code vector candidates and the spectrum parameter by the use of said subtractor;

successively calculating, in response to the spectrum parameter and the error signals sent through said subtractor, other code vector candidates from a next following one of the stages to the last stage of said vector quantization units to successively produce the other code vector candidates in connection with the error signals calculated by said subtractor;

selecting a specific one of combinations of said first through last sets of the code vector candidates that is concerned with the quantization distortions successively calculated in each of said first through last stages in a time division fashion; and producing said specific one of the combinations as the output encoded signals.

2. A speech parameter encoding method as claimed in claim 1, wherein each of said partial speech signals is located within a frame while said predetermined period is a frame period.

3. A speech parameter encoding method as claimed in claim 2, wherein said selecting step comprises the steps of:

calculating, from said quantization distortions, cumulative distortions for all of the combinations of the first through last sets of the code vector candidates; and selecting, as said specific one of the combinations, one of the combinations that minimizes the cumulative distortions.

4. A speech parameter encoding method as claimed in claim 1, wherein said selecting step comprises the steps of:

calculating last stage distortions for all of the combinations of the first through last sets of the code vector candidates; and selecting, as said specific one of the combinations, one of the combinations that minimizes the last stage distortions.

5. A speech parameter encoding method as claimed in claim 1, said predetermined period being a subframe which is shorter than a frame and which has said predetermined period, wherein said dividing step comprises the steps of:

dividing said speech signal into a plurality of frame speech signals each of which is located within the frame; and subdividing each of said frame speech signals into said partial speech signals each of which is located within the predetermined period.

6. A speech parameter encoding method as claimed in claim 5, wherein said selecting step comprises the steps of:

calculating, from said quantization distortions, cumulative distortions for all of the combinations of the first through last sets of the code vector candidates; and determining, as said specific one of the combinations, one of the combinations that is concerned with the cumulative distortions.

7. A speech parameter encoding method as claimed in claim 6, wherein said determining step comprises:

calculating the quantization distortion of a preselected one of said subframes by the use of said code vector candidates and a predetermined code book previously obtained by training; and selecting, as said specific one of the combinations, one of said combinations that minimizes sums of the cumulative distortions and said quantization distortion of said preselected one of said subframes.

8. A speech parameter encoding method as claimed in claim 5, wherein said selecting step comprises the steps of:

calculating last stage distortions for all of the combinations of the first through last sets of the code vector candidates; and determining, as said specific one of the combinations, one of the combinations that is concerned with the last stage distortions.

9. A speech parameter encoding method as claimed in claim 8, wherein said determining step comprises:

calculating the quantization distortion of a preselected one of said subframes by the use of said code vector candidates and a predetermined code book previously obtained by training; and selecting, as said specific one of the combinations, one of said combinations that minimizes sums of the last stage distortions and said quantization distortion of said preselected one of said subframes.

10. A speech parameter encoding method of encoding a speech signal into a sequence of output encoded signals, said method comprising the steps of:

dividing said speech signal into a sequence of frame speech signals each of which has a predetermined period;

subdividing each of said frame speech signals into a plurality of subframe speech signals each of which lasts for a subframe period shorter than said frame period;

successively calculating a spectrum parameter for a predetermined one of said subframe speech signals;

successively giving said spectrum parameter calculated for said predetermined one of the subframe speech signals to a vector quantizer circuit which comprises first through last stages of vector quantization units connected in cascade from the first stage to the last stage through a subtractor interposed between two adjacent ones of said first through said last stages of the vector quantization units, each of said vector quantization units carrying out vector quantization by the use of a code book which stores a plurality of code vectors determined in relation to quantization distortions from said spectrum parameter while said subtractor produces error signals;

calculating said first set of the code vector candidates in said first stage of the vector quantization units by the use of the code book of the first stage in consideration of said quantization distortions between said spectrum parameter and each of said code vectors stored in the code book of the first stage;

calculating the error signals representative of differences between said first set of the code vector candidates and the spectrum parameter by the use of said subtractor;

successively calculating, in response to the spectrum parameter and the error signals sent through said subtractor, other code vector candidates from a next following one of the stages to the last stage of said vector quantization units to successively produce the other code vector candidates as second through the last sets of the code vector candidates in connection with the error signals calculated by said subtractor;

obtaining selected code vector sets which minimize one of cumulative distortions in the first through last stages and last stage distortions in the last stage;

preparing a coefficient code book which stores coefficients related to said spectrum parameter;

successively calculating the quantization distortions of a prescribed one of said subframes by the use of said selected code vector sets and said coefficient code book;

selecting a specific one of said coefficients that minimizes the quantization distortions successively calculated in each of said first through last stages in a time division fashion; and producing said specific one of the coefficients as the output encoded signals.

11. A speech parameter encoding method of encoding a speech signal into a sequence of encoded speech signals by the use of a spectrum parameter having an order specified by dimensions of coefficients, said method comprising the steps of:

dividing said speech signal into a sequence of frame speech signals each of which lasts for a frame period;

calculating said spectrum parameter to a predetermined order for each of said frame speech signals, said predetermined order of the spectrum parameter being represented by the coefficients having a dimension number which is equal to the predetermined order;

dividing said coefficients into a plurality of divided coefficients each of which has a divided dimension number smaller than said order number;

preparing a plurality of code books each of which stores a plurality of code vectors for said divided coefficients;

successively searching each of said code books for each of said divided coefficients to read selected code vectors out of each of said code books and to produce said selected code vectors as code vector candidates for each of said divided coefficients;

calculating cumulative distortions for said predetermined order in connection with combinations of said code vector candidates;

selecting, as a specific code vector, one of said combinations that minimizes said cumulative distortions; and producing said specific code vector as said encoded speech signals.

12. A speech parameter encoding method of encoding a speech signal into a sequence of encoded speech signals by the use of a spectrum parameter which has an order and which is specified by coefficients having dimensions, said method comprising the steps of:

dividing said speech signal into a sequence of frame speech signals each of which lasts for a frame period;

calculating said spectrum parameter to a predetermined order for each of said frame speech signals to produce a restricted spectrum parameter of said predetermined order represented by the coefficients having a dimension number which is equal to the predetermined order;

carrying out vector quantization for said restricted spectrum parameter through a plurality of vector quantizer stages to produce a set of code vector candidates from at least one of said vector quantizer stages and to produce the other sets of code vector candidates from the other code vector quantizer stage by dividing the coefficients of said restricted spectrum parameter into a plurality of partial coefficients each of which has a partial dimension smaller than said dimension number of said restricted spectrum parameter, by preparing a plurality of code books for said partial coefficients, and by searching the code books for the respective partial coefficients;

calculating cumulative distortions for combinations of said set and the other sets of the code vector candidates;

selecting a specific one of the combinations that minimizes the cumulative distortions; and producing said specific one of the combinations as the encoded speech signals.

13. A speech parameter encoding method of encoding a speech signal into a sequence of encoded speech signals by the use of a spectrum parameter which has an order and which is specified by coefficients having dimensions, said method comprising the steps of:

dividing said speech signal into a plurality of frame speech signals each of which lasts for a frame period;

subdividing each of said frame speech signals into a plurality of subframe speech signals each of which lasts for a subframe period shorter than said frame period;

calculating the spectrum parameter to a predetermined order for at least one of said subframe speech signals to produce at least one restricted spectrum parameter of said predetermined order composed of the coefficients having a dimension number equal to said predetermined order;

quantizing a selected one of said at least one restricted spectrum parameter into a quantized value by the use of code vector candidates stored in a code book; and further quantizing another restricted spectrum parameter for remaining at least one of said subframe speech signals by the use of said quantized value.

14. A speech parameter encoding method as claimed in claim 13, wherein said further quantizing step comprises the steps of:

preparing a coefficient code book which stores code vectors representative of coefficients;

calculating another restricted spectrum parameter for remaining at least one of said subframe speech signals with reference to said code vectors stored in said coefficient code book together with said quantized value.

15. A speech parameter encoding method as claimed in claim 13, wherein said further quantizing step comprising the steps of:

nonlinearly processing another restricted spectrum parameter to produce a processed parameter; and calculating another restricted spectrum parameter for remaining at least one of said subframe speech signals with reference to said processed parameter together with said quantized value.

16. A speech parameter encoding method of encoding a speech signal into a sequence of encoded speech signals by the use of a spectrum parameter which has an order and which is specified by coefficients having dimensions, said method comprising the steps of:

dividing said speech signal into a plurality of frame speech signals each of which lasts for a frame period;

subdividing each of said frame speech signals into a plurality of subframe speech signals each of which lasts for a subframe period shorter than said frame period;

calculating the spectrum parameter to a predetermined order for at least one of said subframe speech signals to produce at least one restricted spectrum parameter of said predetermined order composed of the coefficients having a dimension number equal to said predetermined order;

quantizing a selected one of said at least one restricted spectrum parameter into a quantized value by the use of code vector candidates stored in a code book to produce a quantized value signal representative of said quantized value;

calculating a difference between said quantized value and another restricted spectrum parameter for remaining at least one of said subframe speech signals to produce a difference signal representative of said difference;

further quantizing said difference signal to produce a quantized difference signal by the use of code vectors which are stored in a code book to represent differences; and producing said quantized value signal and said quantized difference signal as said encoded speech signals.

17. A speech parameter encoder for use in encoding a speech signal into a sequence of output encoded signals, said encoder comprising:

dividing means supplied with said speech signal for dividing said speech signal into a sequence of partial speech signals each of which has a predetermined period;

calculation means supplied with said partial speech signal sequence for successively calculating a spectrum parameter at every one of said partial speech signals; and a vector quantization circuit supplied with said spectrum parameter at a predetermined one of said partial speech signals for carrying out vector quantization of the spectrum parameter at said predetermined one of the partial speech signals to produce said output encoded signal sequence;

said vector quantization circuit comprising:

first through last stages of vector quantization units each of which carries out vector quantization of a stage input signal, said first through said last stages of the vector quantization units producing first through last stage sets of code vector candidates together with first through last stages of vector quantization distortions concerned with the first through the last stage sets of the code vector candidates, respectively;

subtractor means between two adjacent ones of said first through said last stages of the vector quantization units to connect said two adjacent ones of the first through the last stages of the vector quantization units in cascade to each other, said two adjacent ones of the first through the last stages of the vector quantization units being composed of a preceding and a following stages of the vector quantization units, said subtractor means being supplied with the spectrum parameter and a selected one of the first through the last stage sets of the code vector candidates that is sent from the preceding stage of the vector quantization units to produce error signals representative of differences between the spectrum parameter and the selected one of the first through the last stage sets of the code vector candidates, said error signal being sent to the following stage of the vector quantization units as said stage input signal; and cumulative calculation means supplied with the first through the last stages of the vector quantization distortions for calculating a sum of the first through the last stages of the vector quantization distortions to produce a cumulative distortion as said sequence of the output encoded signals.

18. A speech parameter encoder as claimed in claim 17, wherein each of said first through said last stages of vector quantization units comprises:

a code book for storing a plurality of code vectors; and a vector quantizer supplied with said stage input signal and connected to said code book for carrying out the vector quantization of the stage input signal with reference to the code vectors read out of the code book to produce each of said first through said last stage sets of the code vector candidates together with each of said first through said last stages of the vector quantization distortions.

19. A speech parameter encoder as claimed in claim 17, wherein each of said first through said last stages of vector quantization units comprises:

a code book for storing a plurality of code vectors; and a vector quantizer supplied with said stage input signal and connected to said code book for carrying out the vector quantization of the stage input signal with reference to the code vectors read out of the code book to produce each of said first through said last stage sets of the code vector candidates together with each of said first through said last stages of the vector quantization distortions.

20. A speech parameter encoder for use in encoding a speech signal into a sequence of output encoded signals, said encoder comprising:

dividing means supplied with said speech signal for dividing said speech signal into a sequence of frame speech signals each of which has a predetermined period;

subdividing means supplied with said sequence of frame speech signals for subdividing each of said frame speech signals into a plurality of subframe speech signals each of which lasts for a subframe period shorter that said frame period;

calculating means supplied with said plurality of subframe signals for successively calculating a spectrum parameter for a predetermined one of said subframe speech signals;

a vector quantization circuit, comprising a plurality of vector quantization units which are connected in cascade from one another through a subtractor and which successively process the spectrum parameters in series, for said predetermined one of the subframe speech signals for carrying out vector quantization of said spectrum parameter at said predetermined one of the subframe speech signals to produce said output encoded signal sequence;

said vector quantization circuit comprising:

first through last stages of vector quantization units, each of which carries out vector quantization of a stage input signal, said first through said last stages of the vector quantization units producing first through last stage sets of code vector candidates together with first through last stages of vector quantization distortions concerned with the first through the last stage sets of the code vector candidates, respectively;

subtractor means between two adjacent ones of said first through said last stages of the vector quantization units to connect said two adjacent ones of the first through the last stages of the vector quantization units in cascade to each other, said two adjacent ones of the first through the last stages of the vector quantization units being composed of a preceding and a following stages of the vector quantization units, said subtractor means being supplied with the spectrum parameter and a selected one of the first through the last stage sets of the code vector candidates that is sent from the preceding stage of the vector quantization units to produce error signals representative of differences between the spectrum parameter and the selected one of the first through the last stage sets of the code vector candidates, said error signal being sent to the following stage of the vector quantization units as said stage input signal;

cumulative calculation means supplied with the first through the last stages of the vector quantization distortions for calculating a sum of the first through the last stages of the vector quantization distortions, for obtaining selected code vector sets which minimize one of cumulative distortions in the first through last stages and last stage distortions in the last stage;

a coefficient code book which stores coefficients related to said spectrum parameter being used with said selected code vector sets to successively calculate the quantization distortions of a prescribed one of said subframes;

said cumulative calculation means selecting a specific one of said coefficients that minimizes the quantization distortions successively calculated in each of said first through last stages in a time division fashion and producing said specific one of the coefficients as the output encoded signals.

21. A speech parameter encoder for encoding a speech signal into a sequence of encoded speech signals by the use of a spectrum parameter having an order by dimensions of coefficients comprising:

dividing means for dividing said speech signal into a sequence of frame speech signals each of which lasts for a frame period;

calculation means for calculating said spectrum parameter to a predetermined order for each of said frame speech signals, said predetermined order of the spectrum parameter being represented by the coefficients having a dimension number which is equal to the predetermined order;

a vector quantization circuit supplied with said spectrum parameter for dividing said coefficients into a plurality of divided coefficients each of which has a divided dimension number smaller than said order number;

a plurality of code books each of which stores a plurality of code vectors for said divided coefficients;

said vector quantization circuit successively searching each of said code books for each of said divided coefficients to read selected code vectors out of each of said code books and to produce said selected code vectors as code vector candidates for each of said divided coefficients;

cumulative calculation means for calculating cumulative distortions for said predetermined order in connection with combinations of said code vector candidates;

minimum detecting means for selecting, as a specific code vector, one of said combinations that minimizes said cumulative distortions and for producing said specific code vector as said encoded speech signals.

22. A speech parameter encoder for encoding a speech signal into a sequence of encoded speech signals by the use of a spectrum parameter which has an order and which is specified by coefficients having dimensions, said encoder comprising:

dividing means for dividing said speech signal into a sequence of frame speech signals each of which lasts for a frame period;

calculation means for calculating said spectrum parameter to a predetermined order for each of said frame speech signals to produce a restricted spectrum parameter of said predetermined order represented by the coefficients having a dimension number which is equal to the predetermined order;

a vector quantization circuit supplied with said spectrum parameter for carrying out vector quantization for said restricted spectrum parameter through a plurality of vector quantizer stages to produce a set of code vector candidates from at least one of said vector quantizer stages and to produce the other sets of code vector candidates from the other code vector quantizer stage by dividing the coefficients of said restricted spectrum parameter into a plurality of partial coefficients each of which has a partial dimension smaller than said dimension number of said restricted spectrum parameter, by preparing a plurality of code books for said partial coefficients, and by searching the code books for the respective partial coefficients;

cumulative calculation means for calculating cumulative distortions for combinations of said set and other sets of the code vector candidates; and a minimum detecting means for selecting a specific one of the combinations that minimizes the cumulative distortions and for producing said specific one of the combinations as the encoded speech signals.

23. A speech parameter encoder as claimed in claim 22, further comprising:

a coefficient code book which stores code vectors representative of coefficients; and said calculation means calculating another restricted spectrum parameter, to be supplied to said vector quantization unit, for remaining at least one said subframe speech signals with reference to said code vectors stored in said coefficient code book together with said quantized value.

24. A speech parameter encoder for encoding a speech signal into a sequence of encoded speech signals by the use of a spectrum parameter which has an order and which is specified by coefficients having dimensions, said encoder comprising:

dividing means for dividing said speech signal into a plurality of frame speech signals each of which lasts for a frame period;

subdividing means for subdividing each of said frame speech signals into a plurality of subframe speech signals each of which lasts for a subframe period shorter than said frame period;

calculation means for calculating the spectrum parameter to a predetermined order for at least one of said subframe speech signals to produce at least one restricted spectrum parameter of said predetermined order composed of the coefficients having a dimension number equal to said predetermined order;

a vector quantization circuit supplied with said spectrum parameter for quantizing a selected one of said at least one restricted spectrum parameter into a quantized value by the use of code vector candidates stored in a code book and further quantizing another restricted spectrum parameter for remaining at least one of said subframe speech signals by the use of said quantized value.

25. A speech parameter encoder for encoding a speech signal into a sequence of encoded speech signals by the use of a spectrum parameter which has an order and which is specified by coefficients having dimensions, said encoder comprising:

dividing means for dividing said speech signal into a plurality of frame speech signals each of which lasts for a frame period;

subdividing means for subdividing each of said frame signals into a plurality of subframe speech signals each of which lasts for a subframe period shorter than said frame period;

calculation means for calculating the spectrum parameter to a predetermined order for at least one of said subframe speech signals to produce at least one restricted spectrum parameter of said predetermined order composed of the coefficients having a dimension number equal to said predetermined order;

a vector quantization circuit supplied with said spectrum parameter for quantizing a selected one of said at least one restricted spectrum parameter into a quantized value by the use of code vector candidates stored in a code book to produce a quantized value signal representative of said quantized value;

a difference vector quantization circuit for calculating a difference between said quantized value and another restricted spectrum parameter for remaining at least one of said subframe speech signals to produce a difference signal representative of said difference, for further quantizing said difference signal to produce a quantized difference signal by the use of code vectors which are stored in a code book to represent differences, and for producing said quantized value signal and said quantized difference signal as said encoded speech signals.

* * * * *

UNITED STATES PATENT AND TRADEMARK OFFICE
CERTIFICATE OF CORRECTION

PATENT NO. : 5,271,089
DATED : December 14, 1993
INVENTOR(S) : Kazunori Ozawa

It is certified that error appears in the above-indentified patent and that said Letters Patent is hereby corrected as shown below:

On the title page, item [30], add the following:

Foreign Application Priority Data

July 8, 1991        3-166074
December 26, 1991   3-345661

Col 13, line 5 delete "quartizer" insert --quantizer--

Signed and Sealed this

Eleventh Day of July, 1995

*Attest:*

BRUCE LEHMAN

*Attesting Officer*          *Commissioner of Patents and Trademarks*